United States Patent
Sugawa et al.

(10) Patent No.: US 7,423,222 B2
(45) Date of Patent: Sep. 9, 2008

(54) CIRCUIT BOARD AND METHOD OF MANUFACTURING THE SAME

(75) Inventors: Toshio Sugawa, Katano (JP); Satoshi Murakawa, Neyagawa (JP); Masaaki Hayama, Nara (JP); Takeo Yasuho, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 10/203,970

(22) PCT Filed: Jan. 11, 2002

(86) PCT No.: PCT/JP02/00134

§ 371 (c)(1),
(2), (4) Date: Sep. 18, 2002

(87) PCT Pub. No.: WO02/056651

PCT Pub. Date: Jul. 18, 2002

(65) Prior Publication Data

US 2003/0039811 A1    Feb. 27, 2003

(30) Foreign Application Priority Data

Jan. 15, 2001  (JP) .............................. 2001-006024

(51) Int. Cl.
*H05K 1/11* (2006.01)
*H01R 12/04* (2006.01)

(52) U.S. Cl. .......................... 174/264; 361/792; 439/66

(58) Field of Classification Search ......... 174/262–266; 361/792–795; 439/66
See application file for complete search history.

(56) References Cited

U.S. PATENT DOCUMENTS

| | | | | | |
|---|---|---|---|---|---|
| 4,663,497 | A | * | 5/1987 | Reimann | 174/264 |
| 5,185,502 | A | * | 2/1993 | Shepherd et al. | 174/262 |
| 5,514,326 | A | * | 5/1996 | Tani et al. | 419/9 |
| 5,627,345 | A | * | 5/1997 | Yamamoto et al. | 174/265 |
| 6,077,415 | A | * | 6/2000 | Duruz et al. | 205/384 |
| 6,087,597 | A | * | 7/2000 | Shimada et al. | 174/263 |
| 6,465,742 | B1 | * | 10/2002 | Hiraoka et al. | 174/255 |
| 6,479,763 | B1 | * | 11/2002 | Igaki et al. | 174/262 |
| 6,555,763 | B1 | * | 4/2003 | Hirasawa et al. | 174/264 |

(Continued)

FOREIGN PATENT DOCUMENTS

CN    1361655    7/2002

(Continued)

OTHER PUBLICATIONS

Machine Translation of JP11-251703.*

(Continued)

*Primary Examiner*—Jeremy C Norris
(74) *Attorney, Agent, or Firm*—Steptoe & Johnson LLP

(57) ABSTRACT

A circuit board is manufactured by filling a via-hole formed in an insulating substrate with conductive material, disposing conductive layers on both sides of the insulating substrate, and forming alloy of component material of the conductive material with component material of the conductive layers. In the circuit board, therefore, the conductive material filled in the via-hole formed in the insulating substrate is securely connected electrically as well as mechanically to the conductive layers on both sides of the insulating substrate with high reliability.

8 Claims, 3 Drawing Sheets

U.S. PATENT DOCUMENTS 6,641,898 B2 * 11/2003 Yazaki et al. ............... 428/209
6,713,687 B2 * 3/2004 Yazaki et al. ............... 174/263
6,713,688 B2 * 3/2004 Kokufu et al. ............. 174/264
6,730,856 B2 * 5/2004 Furukuwa ................... 174/256
6,972,070 B2 12/2005 Yazaki et al.

FOREIGN PATENT DOCUMENTS

| EP | 11251703 | 9/1999 |
| EP | 0 955 795 A2 | 11/1999 |
| JP | 7-115255 | 5/1995 |
| JP | 11-251703 * | 9/1999 |

OTHER PUBLICATIONS

State Intellectual Property Office of People's Republic of China; "The Third Office Action" re: Appl. No. 02800069.2, w/ English translation; Issuing Date: Jan. 20, 2006; 6 Pages.

Micropatent Family Available Check; MicroPatent® Family Lookup; Feb. 1, 2006; 3 Pages.

\* cited by examiner

[Fig. 1]
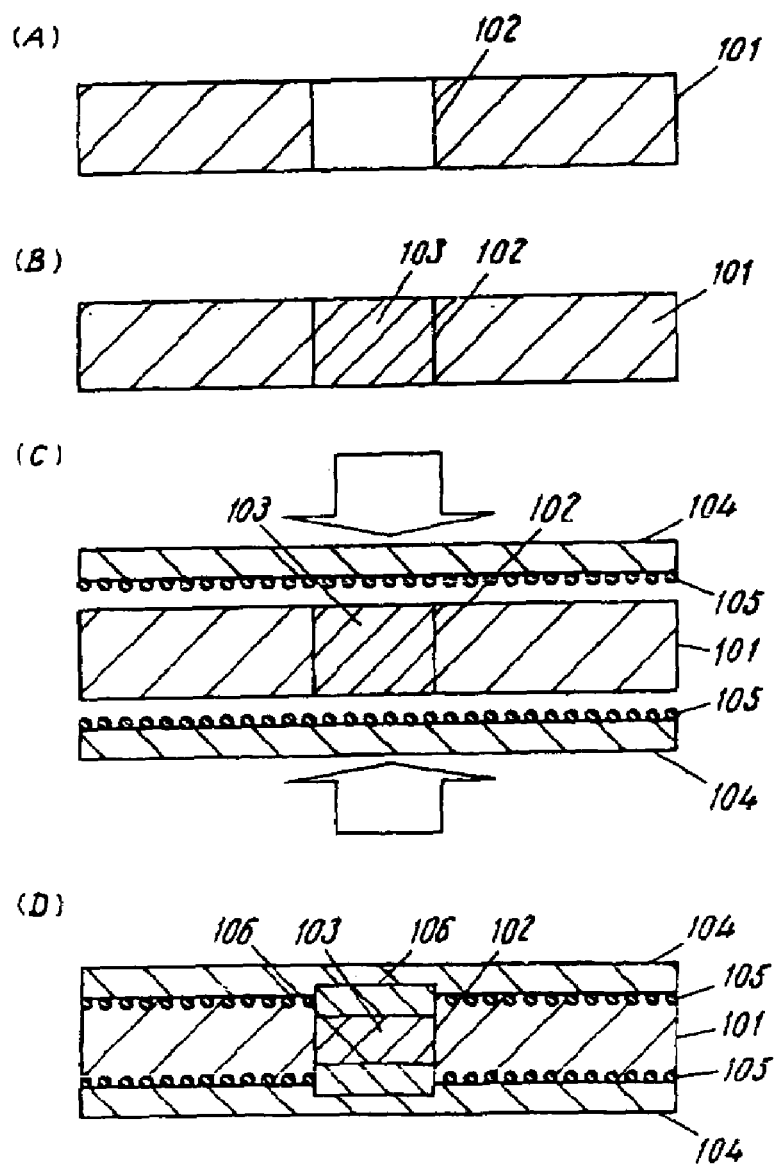

[Fig. 2]
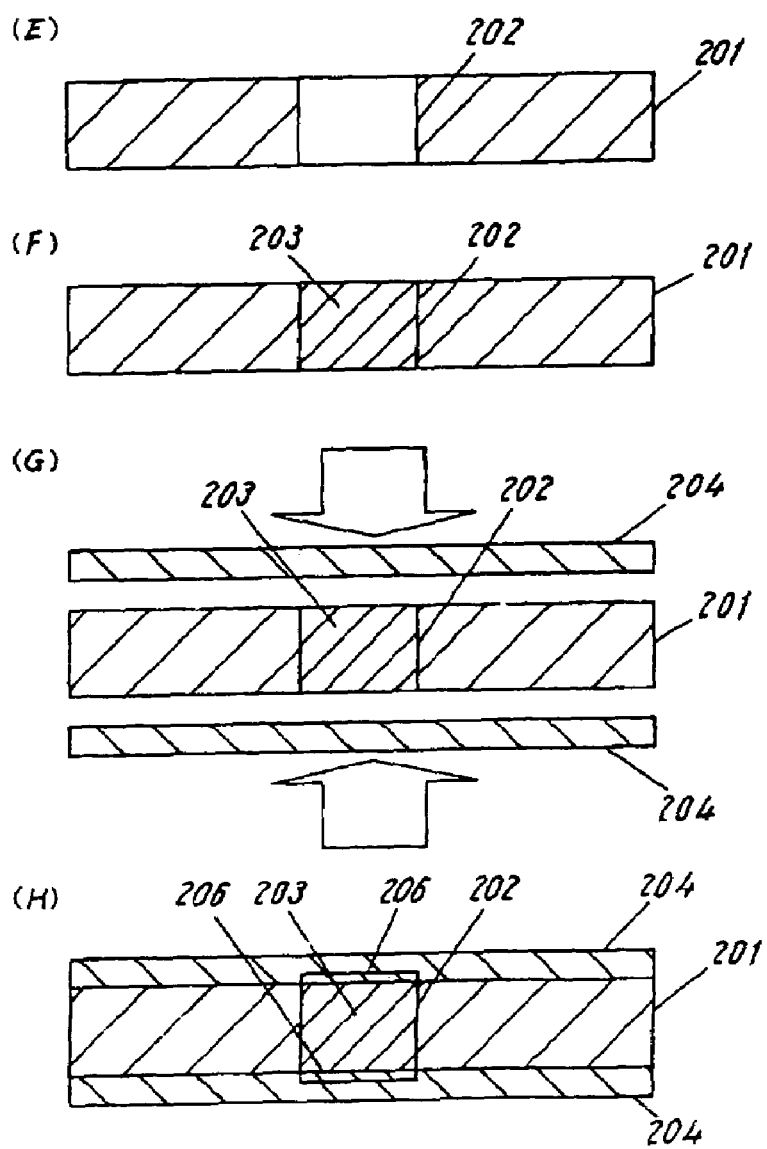

[Fig. 3]
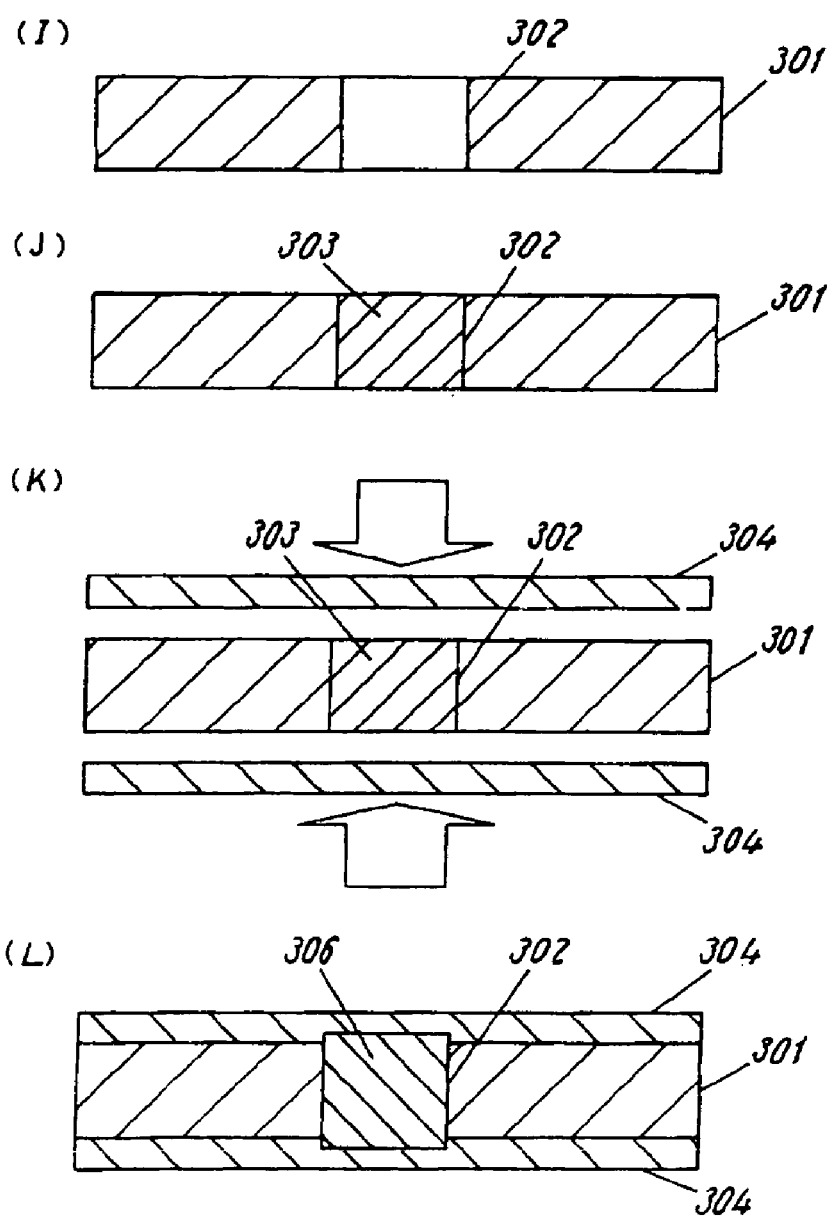

CIRCUIT BOARD AND METHOD OF MANUFACTURING THE SAME

FIELD OF THE INVENTION

The present invention relates to a circuit board including an insulation substrate having a via-hole filled with conductive material, and conductive layers disposed to both sides of the insulation substrate. The invention also relates to a method of manufacturing the board.

BACKGROUND OF THE INVENTION

According to the recent trend toward downsizing of electronic devices, inexpensive circuit boards that are capable of mounting semiconductor chips, such as LSIs, are strongly demanded for not only industrial purposes but also for consumer products. It is imperative that such circuit boards having multi-layered fine wiring patterns can be manufactured easily with high yield rate and high reliability, for the purpose of increasing packaging density.

A conventional circuit board includes a glass-epoxy board, which is an insulation substrate made of woven glass cloth impregnated with epoxy resin, and copper foils bonded by heat-press or the like to both sides of the substrate. In circuit board, patterns are formed by photo-etching the copper foils, a through-hole is formed by drilling or the like, and wiring layers between both side surfaces of the through hole are then connected with copper plated on an interior wall of the through-hole.

In this method, an interior of the through hole, upon being plated, lacks reliability because plating solution does not permeate easily into the hole, and an area which is not plated thus tends to be created, and this may cause a failure of electrical connection. This may cause in deficiency that a thickness of the plated copper deep inside the through-hole, which can cause an electrical problem due to a large resistance for an electric connection. It is difficult to mount a component to a portion where a through-hole is formed. And it is difficult to plate a through-hole in a desired inner layer of a multi-layered substrate. These difficulties limit an arrangement of wiring patterns and manufacturing processes of the circuit board, and also hinder downsizing of the board.

DISCLOSURE OF THE INVENTION

A circuit board is manufactured through filling a via-hole formed in an insulating substrate with conductive material, forming conductive layers on both sides of the insulating substrate, and forming alloy of component material in the conductive material and component material of the conductive layers.

In this circuit board, the conductive material in the via-hole formed in the insulating substrate is securely connected electrically as well as mechanically to the conductive layers on both sides of the insulating substrate reliably.

BRIEF DESCRIPTION OF THE DRAWINGS

FIG. 1A through FIG. 1D are sectional views of a circuit board, illustrating a method of manufacturing the board according to exemplary embodiment 1 of the present invention.

FIG. 2A through FIG. 2D are sectional views of a circuit board, illustrating a method of manufacturing the board according to exemplary embodiment 2 of the invention.

FIG. 3A through FIG. 3D are sectional views of a circuit board, illustrating a method of manufacturing the board according to exemplary embodiment 3 of the invention.

DESCRIPTION OF THE PREFERRED EMBODIMENT

Exemplary Embodiment 1

FIG. 1A through FIG. 1D are sectional views of a circuit board according to exemplary embodiment 1 of the present invention. Insulating substrate 101 may be a glass-epoxy board made of glass cloth impregnated and/or coated with epoxy resin, a resin board made of woven cloth or unwoven cloth of resin fibers, such as aramid impregnated with resin such as epoxy, or a film board made of a plastic film such as polyimide coated with resin such as adhesive material. Insulating substrate 101 is provided with through-hole (via-hole) 102, as shown in FIG. 1A, by laser beam using carbon dioxide, YAG, and the like, or drilling. Via-hole 102 is more favorably formed by laser machining than mechanical method using a drill, since the hole can have its small diameter and its smooth peripheral edge as if it is melted, which is effective for a filling of conductive material at a subsequent process.

Via-hole 102 formed in the insulating substrate 101 is then filled with conductive material 103, as shown in FIG. 1B. Conductive material 103 may employ pasty material containing a granular metal in a form of fine spherical or scaly particles of approximately 0.1 µm to 50 µm mixed with organic solvent and/or resin. The metal may be copper, alloy of copper and silver, or copper having its surface coated or alloyed with another metal like silver, gold or the like. Copper can make particles of spherical shape inexpensively. Copper may be mixed with or coated on its surface with other metal of lower hardness and lower electric resistance than those of copper, such as silver, gold, or the like. The silver or gold may be transformed by press-working in a subsequent process. Accordingly, such metal of lower resistance can further reduce contact resistance since the particles have increased contact surface areas on the copper. Conductive material 103 may be filled into the via-hole 102 by such a method as printing conductive material 103 on one side of the via-hole 102 while the other side is, for example, vacuum-suctioned.

Then, conductive layers 104, for instance, copper foils are placed on respective sides of insulating substrate 101 having via-hole 102 filled with conductive material 103, as shown in FIG. 1C. Metal 105 which can be alloyed with copper is deposited on conductive layer 104 deposited at least at an area contacting with conductive material 103. Metal 105 has a lower melting point than copper, and is alloyed with copper by a temperature-independent reaction such as adhesion and pressure bonding between the metals by a pressure applied in the press-working, and/or by a thermal energy given by heat-press that heats them while applying a pressure in the process, which will be described later. Metal 105 is bonded to each of conductive layers 104 by depositing metal of comparatively low melting point, such as tin, zinc, silver, palladium, indium, or bismuth, by a method, such as plating, thermal spraying. In this embodiment, metal 105, if having a granular form, is alloyed easily since contact areas among the granules become smaller, thereby increasing energy of reaction in pressure and temperature that they receive per unit area. Conductive layers 104 placed on both sides of insulating substrate 101 are then pressed externally while being heated at least at a pressure and a temperature that produce adhesion between insulating substrate 101 and conductive layers 104. The temperature needs to form alloy of the metal to be alloyed with copper. The temperature is preferably 120° C. or higher, but 300° C. or lower, and more preferably ranges from 200° C. to 270° C. In addition, the higher the pressure applied in this process, the better it results. The pressure does not excessively compress insulating resin 101, and thus is, for example, 200 kg/cm$^2$ or less. Indium and bismuth have melting points of 157° C. and 271° C., respectively, as low as tin. They start reactions, e.g. of alloying, at a temperatures ranging generally from 60 to 70% of their melting points. The reactions are accelerated further in this process if they receive additional energy of, e.g., pressure or mechanical activity. Alloy layers containing tin having a melting point of 232° C., while copper has that of 1084° C. of copper, has a desirable condition for an electric resistance and mechanical strength. Tin can be alloyed only with a portion approx. 10% or less of the entire copper. Furthermore, zinc, silver, and palladium having respective melting points of 419° C., 962° C., and 1554° C. are capable of decreasing the contact resistance substantially since they form diffusion layers, and/or since they produce adhesion or pressure bonding even though they do not melt to be alloyed.

Reaction layers 106 are formed as shown in FIG. 1D by adhesion, pressure bonding, and/or alloying at connecting portions at boundaries between conductive layers 104 and the conductive material 103 filled in the via-hole. Copper and metal 105 to be alloyed with the copper to form the reaction layers 106 produce diffusion layers and/or alloy layers only on copper surfaces with practically no need to melt the copper. This increases mechanical strength and decreases electric resistance at the connecting portions. In addition, the copper, since keeping its intrinsic low resistance, provides the connecting portions having a low resistance and high mechanical strength.

Exemplary Embodiment 2

FIG. 2A through FIG. 2D are sectional views of a circuit board according to exemplary embodiment 2 of the present invention.

Insulating substrate 201 made of, for example, a glass epoxy board, a resin board, or a film board is provided with via-hole 202, as shown in FIG. 2A, formed therein in the same manner as described in embodiment 1. Then, the via-hole 202 formed in insulating substrate 201 is filled with conductive material 203 not containing copper but consisting of metal that forms alloy with copper, as shown in FIG. 2B. Conductive material 203 can be filled into via-hole 202 by a method, such as printing conductive material 203 on one side of via-hole 202 while the other side is vacuum-suctioned. Conductive material 203 has a lower melting point than copper, and is alloyed with copper by a temperature-independent reaction, such as adhesion or pressure bonding between these metals by a pressure applied in the press-working, and/or by a thermal energy given by heat-press that heats them while applying a pressure in the process described later. Conductive material 203 may suitably employs soft metal, such as tin, zinc, silver, palladium, conductive indium, bismuth, that have comparatively low melting points and low hardnesses. The metals may be used as material of lead free solder that does not contain noxious lead. Conductive material 203 may be suitably formed in a pasty form made of granular metal in a form of fine spherical or scaly particles of approximately 0.1 μm to 50 μm mixed with organic solvent and/or resin. The metal has relatively high melting point and high hardness, and does not contain copper. The metal may be any other metal excluding copper having surface coated with aforementioned metal, alloy of the aforementioned metal, or any other pure metal.

Next, conductive layers 204 made of copper foils or the like are placed on both sides of the insulating substrate 201 which has via-hole 202 filled with conductive material 203, as shown in FIG. 2C. Conductive layers 204 are then pressed from the outside while being heated at least at a pressure and temperature that produce adhesion between insulating substrate 201 and conductive layers 204. The temperature may be preferably 120° C. or higher, but 300° C. or lower, which can induce a reaction of forming alloy between conductive material 203 and conductive layers 204. The temperature may more preferably be between 200° C. and 270° C. In addition, the higher the pressure applied in this process the better it results. The pressure does not excessively compress the insulating substrate 201, and thus is, for example, 200 kg/cm$^2$ or less. Conductive material 203 can be alloyed easily because of its granular form having a smaller contact area than the granules, thereby increasing energy of reaction in pressure and temperature that they receive per unit area. In addition, conductive material 203, since being filled in via-hole 202 contains soft metal of low hardness, increases contact areas by deformation resulting from a pressure of press working, thereby decreasing an electric resistance in via-hole 202. Nickel, chromium, molybdenum, and tungsten, which have high hardness and high melting point, are effective for a core material to be coated. They help the pressure to act more effectively upon conductive material 203 in the press-working since conductive material 203 consists of soft metal having a comparatively low hardness. In other words, they not only promote conductive material 203 to be alloyed in itself, but also increase contact area that can reduce the contact resistance by the press-working.

Reaction layers 206 are formed as shown in FIG. 2D by the press-working which produces adhesion, pressure bonding, and/or metal alloy of copper and the metal to be alloyed with copper, as discussed above, at connecting portions at boundaries between conductive layers 204 and conductive material 203 filled in the via-hole. It is practically unnecessary to melt the copper in reaction layers 206 if the copper and conductive material 203 to be alloyed with the copper are used. This is because reaction layers 203 need to be formed by diffusion and/or alloying only on surfaces of the copper. This can thus increase mechanical strength of the connecting portions, and decrease an electric resistance. In addition, the copper, since keeping its intrinsic low resistance, provides the connecting portions having a low resistance and high mechanical strength. Reaction layers 206 start reactions to form, for example, alloy at a temperature generally 60 to 70% of its melting point similarly to embodiment 1. The reactions are accelerated even further if they receive additional energy of, for example, pressure or mechanical activity. The alloy layers is in a desirable condition for an electric resistance and mechanical strength if tin is alloyed only with a portion approx. 10% or less of the entire copper. Moreover, contact resistances of the layers can be further decreased since they form diffusion layers, and/or since they produce adhesion or pressure bonding even if they are not alloyed.

Exemplary Embodiment 3

FIG. 3A through FIG. 3D are sectional views of a circuit board, illustrating a method of manufacturing the board according to exemplary embodiment 3 of the present invention.

As shown in FIG. 3A, insulating substrate 301 made of, for example, a glass epoxy board, a resin board, or a film board is provided with via-hole 302 formed therein similarly to embodiments 1 and 2. Then, via-hole 302 is filled with conductive material 303 containing copper and another metal that can be alloyed with copper, as shown in FIG. 3B. Conductive material 303 can be filled into via-hole 302 by a method, such as printing conductive material 303 on one side of via-hole 302 while the other side is vacuum-suctioned. The metal contained in conductive material 303 to be alloyed with copper has a lower melting point than copper, and is alloyed with copper by a temperature-independent reaction, such as adhesion or pressure bonding between these metals by a pressure applied in the press-working, and/or by a thermal energy given by heat-press that heats them while applying a pressure in the process, which will be described later. The metal may be suitably employ tin, zinc, silver, palladium, conductive indium, or bismuth, which is soft metal having comparatively low melting point and low hardness. Material suitable for conductive material 303 is in pasty form made of granular metal in a form of fine spherical or scaly particles of approximately 0.1 µm to 50 µm mixed with organic solvent and/or resin. The metal may be copper or any other metal of relatively high melting point and high hardness with a surface coated with the above-mentioned metal, alloy of copper with the above-mentioned metal, or any other pure metal.

Next, conductive layers 304 consisting of copper foils or the like are placed on both sides of insulating substrate 301 having via-hole 302 filled with conductive material 303, as shown in FIG. 3C. Conductive layers 304 are then pressed from the outside while being heated at least at a pressure and a temperature that produce adhesion between insulating substrate 301 and conductive layers 304. The temperature may be 120° C. or higher, but 300° C. or lower, which makes the copper in conductive layers 304 to form alloy with the metal contained in conductive material 303 and the copper in conductive material 303 to be alloyed with the afore-mentioned metal. The temperature is more preferably between 200° C. and 270° C. In addition, the higher the pressure applied in this process the better it results. The pressure, however, does not excessively compress insulating substrate 301, and thus is preferably 200 kg/cm$^2$ or less. Conductive material 303 can be alloyed easily because of its granular form that having a smaller contact area among the granules, thereby increasing energy of reaction in pressure and temperature that they receive per unit area. In addition, since conductive material 303 filled in via-hole 302, since being composed of soft metal of low hardness, has an contact area increased by deformation resulting from a pressure of press working, thereby decreasing an electric resistance in via-hole 302. Copper is suitable as core material to be coated for conductive material 303 since being relatively inexpensive, having a low electric resistance, and easily forming fine particles of spherical shape. Even with any such metal having relatively high melting point and high hardness, the pressure acts more effectively in the press working upon conductive material 303 since the metal also contains the soft metal having comparatively low hardness. This not only promotes conductive material 303 to be alloyed in itself, but also increases the contact area and reduces the contact resistance by the press working and by the low electric resistance.

Copper is contained in conductive material 303 preferably at 50% or less for the electric resistance, and more preferably at 10% or less for both the electric resistance and mechanical strength. Moreover, contact resistances between conductive material 303 and conductive layers 304 can be further decreased since they form diffusion layers, and/or since they produce adhesion or pressure bonding even if they are not alloyed.

Reaction layer 306 is formed as shown in FIG. 3D by the press-working which produces adhesion, pressure bonding, and/or alloy of copper and the metal to be alloyed with the copper, as discussed above, at connecting portions at boundaries between conductive layers 304 and conductive material 303, as well as an interior of via-hole 302. Thus, the copper need not melt in reaction layer 306 containing the copper and afore-mentioned metal. The copper forms diffusion layers or alloy layers only on surfaces of the copper. This improves mechanical strength and decreases electric resistance of reaction layer 306, and thus provides connecting portions with low resistance and high mechanical strength since interiors of individual copper particles contained in reaction layer 306 keeps its intrinsic low resistance. Reaction layer 306 starts reaction, for example, to form alloy at a temperature generally of 60 to 70% of the melting point similarly to embodiment 1. The reaction is accelerated even further if it receives additional energy of, for example, pressure or mechanical activity.

Reaction layers are formed by adhesion, pressure bonding, and/or alloying at connecting portions in the boundaries between the conductive layers and the conductive material filled in the through via hole. Accordingly, the circuit board is provided with a low resistance and high mechanical strength at the connecting portions since the reaction layers have high mechanical strength and low electric resistance while interior of the copper contained therein keeps its intrinsic low resistance. In addition, a resistance of the conductive layers on both sides of the insulating substrate at the via-hole is reduced since an interior of the reaction layer reduces the resistance of the via-hole. Furthermore, mechanical strength of the connecting portions increases, and the reliability improves by mechanically securing the connections. Moreover, since the via-hole is filled with the conductive material, a component can be mounted on a surface of the conductive layer including an area above the via-hole, which improves downsizing of the circuit board as well as wiring flexibility.

The present invention provides the same effect for a circuit board having a conductive layer formed previously on only one side of a via-hole, i.e., a blind via-hole. In addition, a similar advantage is obtainable with a multi-layered board fabricated by repeating the process described in any of the foregoing embodiments. Like advantage is also accomplished with a circuit board having a conductive layer made previously by transferring a pattern-formed metal foil.

In the foregoing exemplary embodiments, the conductive layers are copper foils, and the conductive material contains copper and another metal that is alloyed with copper. The conductive layer may be composed of other conductive substance instead of copper, and the conductive material may contain any material that can be alloyed with the substance in order to achieve like advantages.

INDUSTRIAL APPLICABILITY

In the circuit board of the present invention, a conductive material filled in a via-hole formed in an insulating substrate and a conductive layers on both sides of the insulating substrate are securely connected electrically as well as mechanically with high reliability, by forming metal alloy of a part of metals that compose the layers and the material.

The invention claimed is:

1. A circuit board comprising:
an insulating substrate having a via-hole formed therein;
a conductive material filled in said via-hole, said conductive material comprising a first component material including a first alloy;
conductive layers on both sides of said insulating substrate, respectively, said conductive layers comprising a second component material; and
reaction layers located in both ends of said via-hole each consisting of a second alloy consisting of said first component material of said conductive material and said second component material of said conductive layers.

2. The circuit board according to claim 1, wherein:
at least one of said conductive layers and said conductive material comprises copper, and
said second alloy comprises copper.

3. The circuit board according to claim 1, wherein:
said conductive layers comprise copper, and
said second alloy in said conductive layers comprises copper.

4. The circuit board according to claim 1, wherein:
said conductive material comprises copper, and
said second alloy in said conductive material comprises copper.

5. The circuit board according to claim 4, wherein said conductive material comprises not more than 50 wt % copper.

6. The circuit board according to claim 1, wherein at least one of said reaction layers is a diffusion layer.

7. The circuit board according to claim 1, wherein said first component material of said conductive material has a melting point lower than a melting point of copper.

8. The circuit board according to claim 1, wherein at least one of said reaction layers projects from said via-hole.

* * * * *